(12) United States Patent
Miettinen

(10) Patent No.: US 6,252,436 B1
(45) Date of Patent: Jun. 26, 2001

(54) METHOD AND ARRANGEMENT FOR DETERMINING STATE INFORMATION OF POWER SEMICONDUCTOR

(75) Inventor: Erkki Miettinen, Helsinki (FI)

(73) Assignee: ABB Industry OY, Helsinki (FI)

( * ) Notice: Subject to any disclaimer, the term of this patent is extended or adjusted under 35 U.S.C. 154(b) by 0 days.

(21) Appl. No.: 09/371,496

(22) Filed: Aug. 10, 1999

(30) Foreign Application Priority Data

Aug. 12, 1998 (FI) .......................................... 981739

(51) Int. Cl.$^7$ .................................................. H03K 5/153
(52) U.S. Cl. .................................................. 327/88; 327/93
(58) Field of Search ................................. 327/277, 427, 327/376, 377, 379, 143, 80, 88, 93

(56) References Cited

U.S. PATENT DOCUMENTS

| 4,591,734 | 5/1986 | Laughton | 327/427 |
| 5,383,082 | 1/1995 | Nishizawa . | |
| 5,635,823 | 6/1997 | Murakami et al. | 323/277 |
| 6,094,087 | 7/2000 | He et al. | 327/434 |

FOREIGN PATENT DOCUMENTS

| 44 28 675 | 2/1996 | (DE) . |
| 44 39 967 | 5/1996 | (DE) . |
| 431 215 A1 | 6/1991 | (EP) . |
| 0 743 751 | 11/1996 | (EP) . |

*Primary Examiner*—Kenneth B. Wells
*Assistant Examiner*—Hiep Nguyen
(74) *Attorney, Agent, or Firm*—Dykema Gossett PLLC

(57) ABSTRACT

A method and arrangement for determining state information of a high-power semi-conductor, the power semiconductor comprising a collector (C), an emitter (E) and a gate (G), and a gate driver (3) comprising an auxiliary voltage input is connected to the gate of the power semiconductor. The method is characterized by steps wherein the auxiliary voltage (Vcc) of the gate driver (3) is used as reference voltage, saturation voltage (Vsat) of the power semiconductor (1) is compared with the reference voltage by using an optoisolator (4), and a detection signal of state information is generated depending on the magnitudes of the saturation voltage and the reference voltage.

5 Claims, 2 Drawing Sheets

METHOD AND ARRANGEMENT FOR DETERMINING STATE INFORMATION OF POWER SEMICONDUCTOR

BACKGROUND OF THE INVENTION

The present invention relates to a method for determining state information of a power semiconductor, the power semiconductor comprising a collector, an emitter and a gate, and a gate driver comprising auxiliary voltage input is connected to the gate of the power semiconductor.

High-speed semiconductors are applied in modern power electronic devices, such as frequency converters used for controlling the rotation speed of short-circuit motors, for instance. Typically, the semiconductors are IGB transistors, which generally tolerate a short-circuit for 10 microseconds at the most. Hence it is important that information on an overcurrent stressing the device is received as soon as possible, in order that power semiconductors can be switched to a non-conducting state before they are damaged as a result of overheating.

Saturation voltage of an IGB transistor, i.e. voltage across the collector and emitter of said component while the collector current flows, depends on the magnitude of the current passing through the semiconductor and its value on a normal operating range is 2 to 4 volts. Saturation voltage rises quickly, when the collector current exceeds the nominal current and so this fact is commonly used for detecting overcurrent. For instance in frequency converters, the maximum value of saturation voltage in direct short-circuit can be close to the voltage of the frequency converter's intermediate circuit. In general, the maximum value of saturation voltage depends on the short-circuit impedance. Commonly the detection limit is the voltage of 10 to 20 volts and the detection must continue for at least two microseconds without a break, in order that the situation would be regarded as an overcurrent that calls for action.

It is previously known to measure the saturation voltage of the power semiconductor in frequency converters by using, for instance, phase-specific and intermediate-circuit-specific voltage dividers with matched speed and amplitude against the negative bar of the frequency converter, and by comparing the value obtained by subtraction with the known reference value. The obtained digital data is in the negative bar potential, but it can be separated galvanically by using optoisolators, for instance.

BRIEF DESCRIPTION OF THE INVENTION

The object of the present invention is to provide a method which eliminates the above-described drawbacks and a plurality of components, and the tuning thereof, required by the above-described method, and makes it possible to provide information on saturation voltage of a power semiconductor and thereby to provide information on a phase state, referenced to desired potential, in a simpler, more reliable and more cost-effective manner. This is achieved with a method of the invention, which is characterized by comprising the steps of using an auxiliary voltage of a gate driver as a reference voltage, comparing a saturation voltage of a power semiconductor with the reference voltage using an optoisolator, and generating a detection signal of state information depending on the magnitudes of the saturation voltage and the reference voltage.

The method of the invention is based on the fact that the existing input voltage of the gate driver is used as such as reference voltage, and the existing optoisolator, needed for galvanic separation, is used as a comparator comparing the saturation voltage of the power semiconductor and the reference voltage. The only additional component required is a separating diode of the optoisolator, which should tolerate in the reverse direction the same voltage as the power semiconductor does. However, this diode is very economical, since only a current of a few milliamperes, in the forward direction of the optoisolator photodiode, passes therethrough. By comparing the saturation voltage information obtained at the optoisolator output and the gate control information of the power semiconductor to be monitored, it can be logically deduced, whether a dangerous overcurrent situation or a common 'switch open situation is concerned.

The invention also relates to an arrangement for determining state information of a power semiconductor, the power semiconductor comprising a collector, an emitter and a gate, and a gate driver comprising auxiliary voltage input is connected to the gate of the power semiconductor, whereby the arrangement is characterized by comprising a reference voltage referenced to the emitter potential of the power semiconductor, and a separation diode and a power semiconductor state detector in series, a first end of the series connection being connected to the reference voltage and a second end to the collector of the power semiconductor. By means of this arrangement the advantages provided by the method of the invention can be achieved with a simple and reliable structure.

BRIEF DESCRIPTION OF THE DRAWINGS

In the following, the invention will be described in greater detail in connection with preferred embodiments, with reference to the attached drawings, in which.

DETAILED DESCRIPTION OF THE INVENTION

Figure 1:
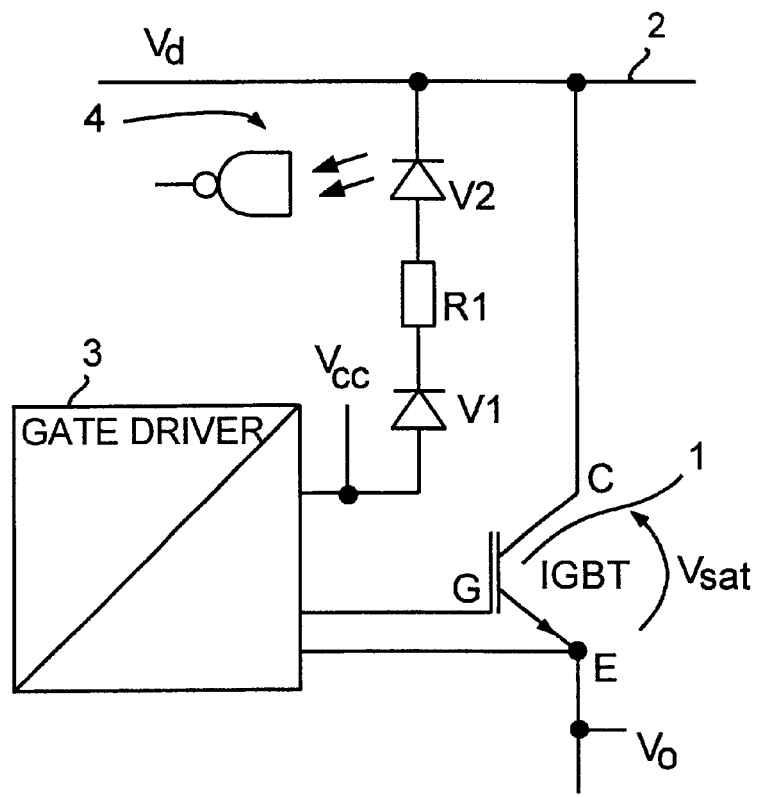
FIG. 1 shows a circuit arrangement implementing the method of the invention.

FIG. 1 shows an arrangement implementing the method of the invention, in which arrangement an IGB transistor (IGBT) 1 exemplifies a power semiconductor. The IGBT is a fairly fast component wherewith high voltages and currents can be switched at a high switching frequency. A collector C of the IGBT is connected to a conductor bar 2 having voltage Vd and a gate G is connected to a gate driver which generates for the IGBT the current and voltage pulses needed for turn-on and turn-off. By the IGBT, the voltage Vd of the collector can be connected to operate as the output voltage Vo of an emitter E.

The gate driver 3 is connected to the emitter of the power semiconductor to determine the zero level of the gate driver. As a result of the connection, the gate driver is in the emitter potential despite the emitter having potential to ground. Auxiliary voltage Vcc of the gate driver on the side of the power semiconductor is typically 15 volts. The auxiliary voltage Vcc is thus referenced to the emitter potential. The function of said auxiliary voltage is to be the source of the voltage required by the gate of the power semiconductor during the turn-on and the conducting state. The coupling in FIG. 1 also shows a diode V1, a matching tolerateor R1 and a photodiode V2 connected in series between the auxiliary voltage Vcc of the gate driver 3 and the collector of the power semiconductor. The function of the diode V1 is to separate a possible high collector voltage from the rest of the circuitry. The photodiode V2 instead is used as a detector of current passing in the circuit, and in accordance with FIG. 1, the photodiode is a part of an optoisolator 4, whereby it is possible to transmit the photodiode signal galvanically separated.

In accordance with the method of the invention, the auxiliary voltage Vcc of the gate driver is used as reference voltage as appears from FIG. 1. When the power semiconductor is in a conducting state in a normal operating situation, the normal collector current passing through the component, a typical saturation voltage Vsat is 2 to 4 volts if the power semiconductor is an IGBT. In accordance with the method, the saturation voltage Vsat is compared with the reference voltage Vcc by using an optoisolator. If the saturation voltage is lower than the reference voltage, a detection signal of state information is generated. Generation of the detection signal is effected, as appears from the figure, so that a current passes through the photodiode V2, whereby the photodiode generates a signal by producing light. In reality, the saturation voltage is compared with the reference voltage, from which are subtracted voltage losses and threshold voltages of other components in the circuit. For instance, in the case of FIG. 1, wherein the auxiliary voltage Vcc, which is typically 15 volts, acts as reference voltage, the actual voltage to be compared is about 12 volts.

If the current passing through the power semiconductor, such as an IGBT, exceeds the nominal current limit predetermined for said component, the saturation voltage of the component grows considerably. Thus as an indication of an overcurrent, the saturation voltage is higher than the reference voltage, and consequently the current cannot pass through the photodiode V2. Since the current does not pass through the photodiode used for detection, while the power semiconductor is controlled to a conducting state, one knows that the collector current of the power semiconductor has increased or is increasing excessively. In the arrangement the diode V1 and the photodiode V2 are connected in series such that they separate the voltage of the collector from the gate driver.

When the power semiconductor 1 is in a non-conducting state, the voltage Vd of the collector C is typically considerably higher than the voltage Vo of the emitter. In this case, the power semiconductor takes all of the voltage across itself, and because the collector voltage as compared with the emitter exceeds the reference voltage, current does not pass through the photodiode V2 used for detection. Current passes through the photodiode used for detection and a detection is obtained only when the collector current of the power semiconductor is within the normal range of current.

Figure 2:
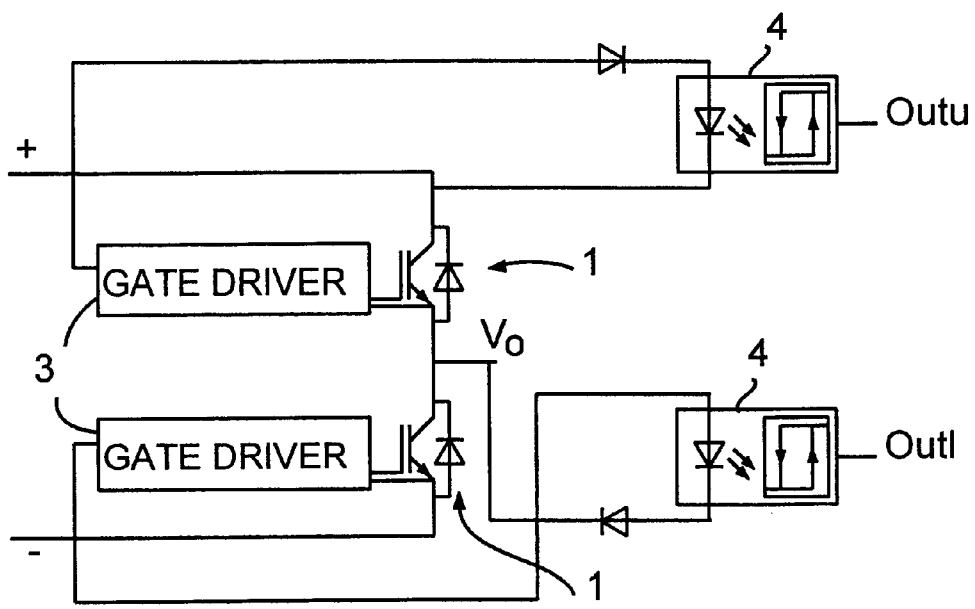
FIG. 2 shows a schematic circuit arrangement in connection with a frequency converter implementing the method of the invention.
Figure 3:
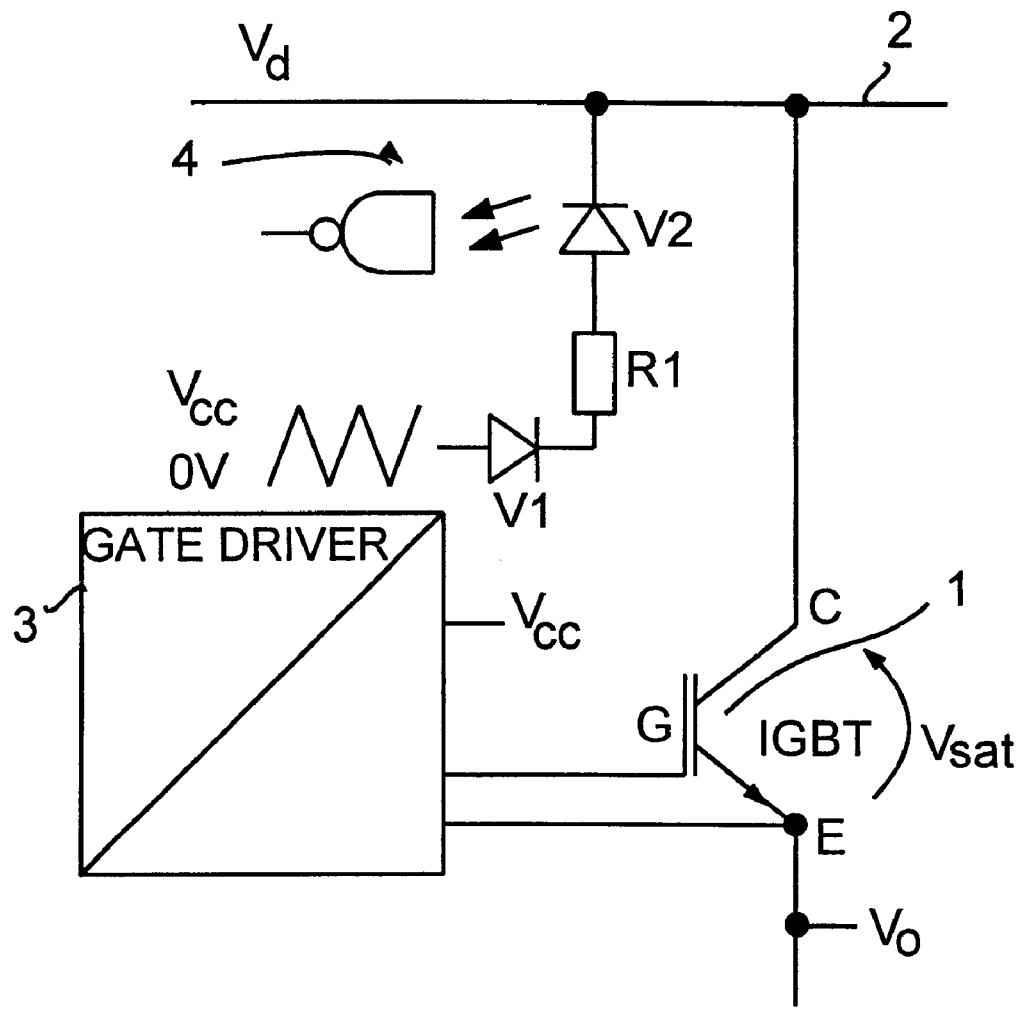
FIG. 3 shows a circuit of one preferred embodiment of the invention.

FIG. 2 shows schematically a connection in a frequency converter implementing the method of the invention, of which the figure shows a connection of one phase by way of example. The method of the invention and the coupling implementing the method can be utilized for providing phase state information required by motor control methods, such as a DTC (Direct Torque Control), apart from monitoring the saturation voltage. The phase state information refers to logical data on whether the phase voltage supplied to the motor is in the potential of the plus bar or the negative bar of the frequency converter, or in a transition state between them. The phase state information is not directly obtainable from the control signals of the power semiconductor gates, since the turn-on and turn-off delays of the semiconductors depend on their operation conditions. This dependence can be compensated by means of the phase state information.

When a phase output is connected either to the plus bar or to the negative bar of an intermediate circuit of the frequency converter with a corresponding power semiconductor, such as an IGBT, a corresponding saturation indicator generates an active signal to the output (Outu, Outl) of an optoisolator 4. From these two facts it is easy to deduce whether the phase output is on the negative bar, whereby Outl is active, on the plus bar, whereby Outu is active, or in the potential therebetween, whereby the output of neither optoisolator is active. The solution eliminates three, high-speed, phase-specific voltage dividers that would otherwise be needed, and moreover, the final result is directly logical and galvanically separated.

In accordance with one preferred embodiment of the invention, a triangular wave is generated from the auxiliary voltage of the gate driver to serve as reference voltage, whereby the saturation voltage of the power semiconductor can be measured. When using a fast triangular or saw-tooth wave as reference voltage, the active output state of the optoisolator operating as a comparator becomes pulse ratio modulated in accordance with the magnitude of the saturation voltage, when the saturation voltage is lower than the peak value of the reference voltage. The minimum value of the triangular wave to be used is advantageously zero volt referenced to the emitter potential of the power semiconductor and the maximum value equals the auxiliary voltage Vcc of the gate driver. When using the triangular wave as reference voltage, the output of the optoisolator changes its state twice for each cycle of the triangular wave, and when the magnitude of the saturation voltage changes, the pulse ratio of the pulses forming at the optoisolator output changes as well. Further, from the pulse ratio of the pulse sequence forming at the output of the optoisolator 4 it is possible to deduce the magnitude of the saturation voltage. The frequency of the reference waveform is most advantageously about 500 kHz, whereby mass-produced, inexpensive optoisolators can be used as comparators. In this case, overcurrent detection takes place within two microseconds at the latest, and a clock frequency of 50 MHz is sufficient to define the modulation ratio with one-percent resolution.

When applying the saturation voltage measuring in accordance with the invention, it is necessary to know the temperature of the power semiconductor as accurately as possible, since it has a substantial effect on the saturation voltage. The temperature can be deduced, for instance, by measuring the temperature of the cooling element.

When the device implementing the method of the invention is a frequency converter, or a similar device, in which it is useful to know the voltage of the load controlled by the device, it is possible in accordance with one preferred embodiment of the invention to sum the magnitudes of the saturation voltages of different power semiconductors to obtain a combined saturation voltage of the power semiconductors. Hence, for instance in frequency converters, by summing the saturation currents of the upper branch and the lower branch power semiconductors, typically an IGBT, it is possible to obtain the information on how much lower the motor voltage is than the intermediate circuit voltage. This information can be utilized, when you need to know the motor voltage as accurately as possible without a semiconductor model dependent on the phase current. By utilizing the embodiment, processor capacity is saved and it is possible to select a lower-speed processor which is also less expensive.

It is obvious to a person skilled in the art that the basic idea of the invention can be implemented in a variety of ways. The invention and its embodiments embodiments are thus not restricted to the above-described examples, but they may vary within the scope of the claims.

What is claimed is:

1. A method for determining state information of a power semiconductor, the power semiconductor having a collector, an emitter and a gate, and a gate driver with an auxiliary voltage input connected to the gate of the power semiconductor, comprising the steps of:

using the auxiliary voltage of the gate driver as a reference voltage, comparing a saturation voltage of the power semiconductor with the reference voltage using an optoisolator, and generating a detection signal of state information depending on the magnitudes of the saturation voltage and the reference voltage.

2. A method as claimed in claim 1, wherein generating a triangular wave from the auxiliary voltage of the gate driver to serve as the reference voltage, forming a pulse ratio modulated signal, having a frequency proportional to the saturation voltage of the power semiconductor, to operate as the a detection signal of state information, and wherein, the saturation voltage of the power semiconductor is proportional to the pulse ratio modulated signal.

3. A method as claimed in claim 2, for use in frequency converters and the like employing a plurality of power semiconductors, comprising the step of: summing the saturation voltages of predetermined power semiconductors to obtain a combined saturation voltage.

4. An arrangement for determining state information of a power semiconductor having a collector, an emitter and a gate, and a gate driver with an auxiliary voltage input connected to the gate of the power semiconductor, comprising: a separation diode coupled to the auxiliary voltage of the gate driver forming a reference voltage and a photodiode connected in series with the separation diode and having an end connected to the collector of the power semiconductor, said photodiode operative as an optoisolator, said separation diode and said photodiode having the same polarity.

5. An arrangement as claimed in claim 4, wherein the reference voltage comprises a triangular wave generated from the auxiliary voltage of the gate driver, the photodiode having an optically isolated output, comprising a pulse ratio modulated signal proportional to the satuation voltage of the power semiconductor.

* * * * *